(12) United States Patent
Matsuda et al.

(10) Patent No.: US 7,275,309 B2
(45) Date of Patent: Oct. 2, 2007

(54) METHOD OF MANUFACTURING ELECTRICAL RESISTANCE HEATING ELEMENT

(75) Inventors: Hiroto Matsuda, Ogaki (JP); Kazuhiro Nobori, Handa (JP); Yutaka Mori, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 501 days.

(21) Appl. No.: 10/903,893

(22) Filed: Jul. 30, 2004

(65) Prior Publication Data
US 2005/0056976 A1    Mar. 17, 2005

Related U.S. Application Data

(60) Provisional application No. 60/494,525, filed on Aug. 12, 2003.

(51) Int. Cl.
*H05B 3/00* (2006.01)
(52) U.S. Cl. ............... 29/611; 29/613; 29/619; 29/829; 29/848; 29/851; 118/723 E; 118/723 R; 219/444.1; 219/544; 264/618; 264/682; 264/683
(58) Field of Classification Search ............... 29/611, 29/613, 619, 829, 848, 851; 118/723 E, 118/723 R; 219/444.1, 544; 264/618, 682, 264/683
See application file for complete search history.

(56) References Cited

U.S. PATENT DOCUMENTS

| | | | |
|---|---|---|---|
| 6,101,969 A * | 8/2000 | Niori et al. | 118/723 E |
| 6,225,606 B1 | 5/2001 | Tsuruta et al. | |
| 6,483,690 B1 | 11/2002 | Nakajima et al. | |
| 6,534,751 B2 * | 3/2003 | Uchiyama et al. | 219/444.1 |
| 2001/0043452 A1 | 11/2001 | Divakar et al. | |

FOREIGN PATENT DOCUMENTS

| | | |
|---|---|---|
| EP | 0212124 | 3/1987 |
| EP | 1213753 | 6/2002 |
| JP | 05-275434 | 10/1993 |
| KR | 1999-66885 | 8/1999 |
| WO | 02/34451 | 5/2002 |

* cited by examiner

*Primary Examiner*—A. Dexter Tugbang
*Assistant Examiner*—Tim Phan
(74) *Attorney, Agent, or Firm*—Burr & Brown

(57) ABSTRACT

A method of manufacturing an electrical-resistance heating element includes forming sintered ceramics or calcined ceramics, forming an electrode on the sintered ceramics or the calcined ceramics, and forming a ceramic base material having mainly a high melting point metal on the electrode embedded therein, thereby forming a heating element with built-in electrode.

11 Claims, 3 Drawing Sheets

METHOD OF MANUFACTURING ELECTRICAL RESISTANCE HEATING ELEMENT

CROSS REFERENCE TO RELATED APPLICATION

This application is based upon and claims the benefit of priority from prior U.S. Provisional Application No. 60/494,525, filed on Aug. 12, 2003; the entire contents of which are incorporated herein by reference.

BACKGROUND OF THE INVENTION

1. Field of the Invention

The present invention relates to a method of manufacturing an electrical-resistance heating element, such as a heater, an electrostatic chuck, or an RF susceptor, to be applied to a semiconductor manufacturing apparatus such as a thermal CVD apparatus or an etching apparatus.

2. Description of the Related Art

In the field of semiconductor manufacturing technology, a wafer or the like is often subjected to processes such as plasma etching, chemical vapor deposition (CVD), and ion plating. For these processes, a heating apparatus (or a heater) is used as a component for heating the wafer, and an electrostatic chuck and an RF susceptor is used as a component for fixing or holding the wafer.

The semiconductor manufacturing apparatus such as the CVD apparatus or the etching apparatus, mentioned above, typically uses corrosive gas, such as chlorine gas or fluorine gas, for deposition, etching, or cleaning. Heretofore, a resistance-heating element having a surface coated with a metallic material such as stainless steel has been used as the heater. However, conventional semiconductor manufacturing apparatuses have a problem of particles developing. More specifically, the heater or the susceptor is corroded by corrosive gas such as chlorine gas, and thus, chloride, oxide or other particles develop on the inside surface of the heater or the susceptor.

Japanese Patent Application Laid-Open Publication No. 6-151332 discloses, in FIG. 1 and its corresponding description on page 2, an approach for preventing particles from developing. The application discloses a ceramic heating resistor including a susceptor made of a dense ceramic material having corrosion resistance, a resistance-heating element made of a high melting point metal, and a plasma-generating electrode, wherein the resistance-heating element and the plasma-generating electrode are embedded in the susceptor.

First, a method of manufacturing the ceramic heating resistor mentioned above includes forming a preform by charging ceramic powder into a press tool; and forming a continuous concave or groove in the surface of the preform along a predetermined planar pattern. Then, the method includes forming a resistance-heating element by bonding terminals on both ends of a winding of a high melting point metal wire; placing the resistance-heating element in the concave or groove; charging ceramic powder on the resistance-heating element; and performing molding. The method further includes disposing a meshed RF electrode on a molded form having the resistance-heating element embedded therein; charging ceramic powder on the electrode; and then performing molding. Then, the method includes uniaxially pressing the ceramic powder into a disc-shaped molded form; and sintering the disc-shaped molded form by means of hot pressing.

In the ceramic heating resistor manufactured by the method mentioned above, the resistance-heating element made of the high melting point metal is embedded in the dense ceramic base material. Thus, the ceramic heating resistor can directly heat a wafer as placed thereon, so that the ceramic heating resistor can achieve improvements in soaking characteristics and heating response. Moreover, the plasma-generating electrode is embedded in the ceramic base material, thus having the properties of insulation from a surface on which a wafer is placed. Thus, the ceramic heating resistor can eliminate direct application of a current to a wafer placed thereon, so that a wafer can be placed directly on the ceramic heating resistor without the risk of contamination. Therefore, the ceramic heating resistor has the advantage of enabling efficient heating of a wafer.

However, the method of manufacturing the ceramic heating resistor mentioned above has the problem of shrinkage of the molded form incident to densification which occurs during sintering, because the steps of charging the ceramic powder and sintering the molded form take place after the step of disposing the winding of the high melting point metal wire on the preform. After sintering, the deformed molded form creates variations in the thickness of a ceramic layer (hereinafter referred to as "the thickness of a dielectric layer") between the surface of the ceramic heating resistor (that is, the surface on which a wafer is placed) and the plasma-generating electrode.

A non-uniform thickness of the dielectric layer leads to non-uniform generation of plasma, because the intensity of plasma depends on the position at which the plasma-generating electrode is embedded, that is, the thickness of the dielectric layer. Non-uniform generation of plasma leads to non-uniform deposition on a wafer or the like, thus to a reduction in the yield of a product such as a wafer, and thus to deterioration in quality, which is a problem of the above-mentioned method.

Improved yields of products are required due to the trend of higher-density semiconductors and finer wiring rules, and thus a uniform thickness of the dielectric layer is also required. For example, variations in the thickness of the dielectric layer have hitherto been within plus or minus about 0.5 mm from the average thickness thereof. For interlayer dielectrics for use in 1-G DRAMs (dynamic RAMs), variations in the thickness of the dielectric layer, however, must fall within plus or minus 0.05 mm from the average thickness thereof in order that the dielectric layer has a uniform thickness. Thus, a semiconductor manufacturing apparatus has to reduce the range of variations in the thickness of the dielectric layer so as to ensure uniform generation of plasma, as compared to the prior-art apparatuses.

Other and further feature, advantages, and benefits of the present invention will become more apparent from following description taken in conjunction with the following drawings.

SUMMARY OF THE INVENTION

As mentioned above, it is known that there is a correlation between uniformity in plasma and variations in the thickness of the dielectric layer (i.e., evenness).

An object of the present invention is to provide a method of manufacturing an electrical-resistance heating element, which is capable of ensuring uniform generation of plasma To achieve the above object, in one aspect according to the present invention, a method of manufacturing an electrical-resistance heating element includes forming sintered ceramics or calcined ceramics; forming an electrode on the sintered ceramics or the calcined ceramics; and forming on the electrode a ceramic base material having mainly a high melting point metal embedded therein, thereby forming a heating element with built-in electrode.

According to the present invention, the plasma-generating electrode is formed on the sintered ceramics. This makes it possible to prevent the sintered ceramics from shrinking during sintering or from deforming due to variations in thermal conductivity in the sintered ceramics. When the sintered ceramics have a predetermined shape and the electrode is formed on the sintered ceramics, this arrangement enables disposing the electrode at a predetermined position, and also enables reducing the range of variations in the thickness of the dielectric layer.

In another aspect according to the present invention, the method may include grinding the sintered ceramics or the calcined ceramics into a convex shape at the center on the surface of the sintered ceramics or the calcined ceramics on which the electrode is to be formed, wherein the grinding is followed by the step of forming the electrode.

According to the present invention, the sintered ceramics are ground into a convex shape at the center on the surface of the sintered ceramics on which the electrode is to be formed. This allows reducing local application of high pressure at the center, and thus allows reducing the range of variations in the thickness of the dielectric layer.

Further, the heating element with built-in electrode is any one selected from the group consisting of a heater, an electrostatic chuck, and a susceptor.

According to the present invention, the ceramic heating resistor and the like can ensure uniform generation of plasma. As a result, the present invention can improve the accuracy of deposition or etching.

In another aspect according to the present invention, the electrode is any one of shape selected from the group consisting of a linear, plate and meshed electrode made of a bulk or printed body. Further, the electrode is made of a high melting point metal as a main component.

The present invention can reduce the range of variations in the thickness of the dielectric layer, even when a deformable electrode is used.

In another aspect according to the present invention, the sintered ceramics or the calcined ceramics includes at least one of ceramic powder selected from the group consisting of aluminum nitride (AlN), silicon carbide (SiC), and silicon nitride ($SiN_X$, $Si_3N_4$), and the said ceramic powder is formed into a molded form, which is then sintered or calcined into a sintered or calcined form, which is used as the sintered ceramics or the calcined ceramics.

The present invention can improve the efficiency of heating of the heating element with built-in electrode, because aluminum nitride, silicon carbide, and silicon nitride have high thermal conductivity. When sintered AlN is used as the sintered ceramics, the sintered ceramics can achieve high corrosion resistance to halogen corrosive gas.

Further, in the present invention, the high melting point metal is made of at least any one of metal selected from the group consisting of Mo (molybdenum), W (tungsten), WC (tungsten carbide), $Mo_2C$, and W/Mo alloy.

In the present invention, it can be applied to a semiconductor manufacturing apparatus for, in particular, high-temperature applications such as thermal CVD.

In the present invention, the forming the heating element includes charging ceramic powder to embed the high melting point metal on the electrode; forming the ceramic powder into a molded form; and then sintering or calcining the molded form, thereby forming the ceramic base material.

Further, in the present invention, the ceramic powder having the high melting point metal embedded therein is formed into the molded form, and thereafter the molded form is sintered. Thus, a simple method can be used to manufacture a product.

In the present invention, the grinding may take place so that the ratio of the thickness T to the overall thickness A (T/A) is equal to or less than ⅛, where the overall thickness A is the overall thickness of the sintered ceramics or the calcined ceramics, and the thickness T is the thickness of the ground sintered or calcined ceramics having an upper portion in convex shape, between the position at which the width of the diameter of the sintered or calcined ceramics becomes small and the top of the sintered or calcined ceramics. Preferably, the ratio (T/A) lies between 1/20 and 1/10 inclusive.

Further, grinding takes place so that the T/A ratio falls within the above-mentioned range. This allows reducing the range of variations in applied pressure, so that the electrode can be flatly embedded.

DETAILED DESCRIPTION OF THE PREFERRED EMBODIMENTS

Hereinafter, a method of manufacturing an electrical-resistance heating element according to an embodiment of the invention, taking a ceramic heating resistor as an example of the electrical resistance heating element, is described principally with reference to the accompanying drawings FIGS. 1 to 3 and Table 1

Figure 1A:
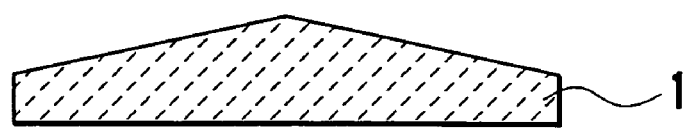
FIG. 1A to FIG. 1C are schematic illustrations explaining steps of a method of manufacturing a ceramic heating resistor according to an embodiment of the invention.
Figure 1B:
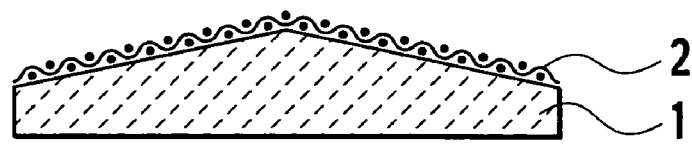
Figure 1C:
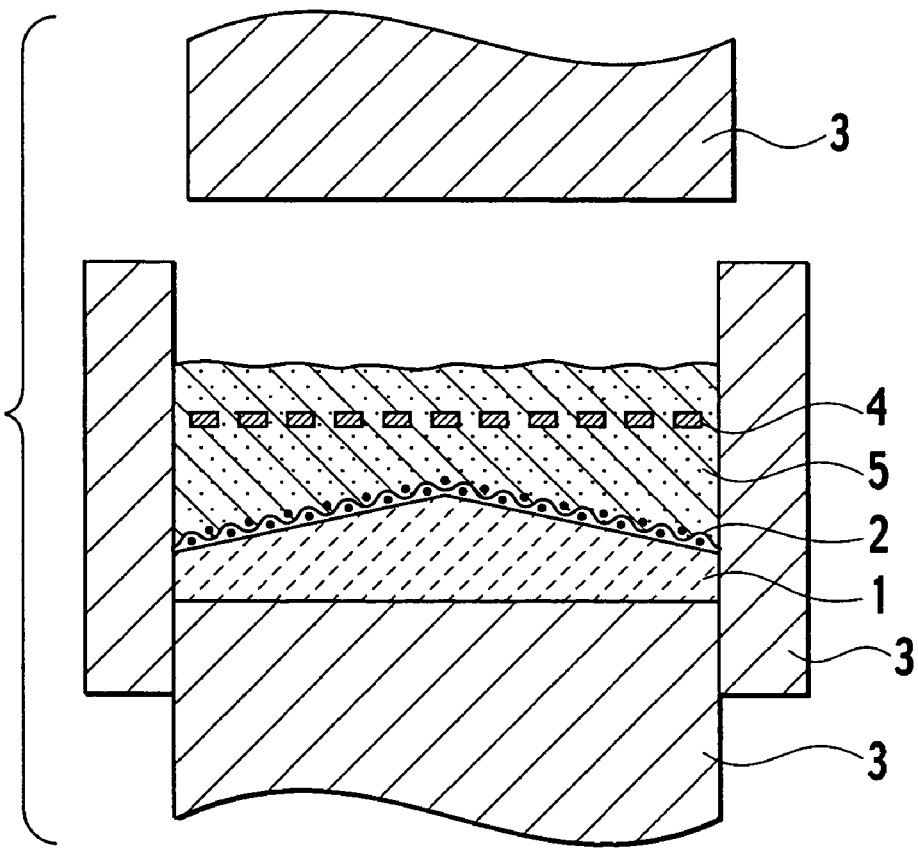

FIGS. 1A to 1C are schematic illustrations for assistance in explaining steps showing the procedure of a method of manufacturing a ceramic heating resistor. First, step 1 takes place as shown in FIG. 1A. Ceramic powder is formed into a molded form, and then the molded form is sintered into sintered ceramics 1. Then, step 2 takes place as shown in FIG. 1B. A meshed RF electrode 2 for generating plasma is formed on the sintered ceramics 1. Then, step 3 takes place as shown in FIG. 1C. The sintered ceramics 1, with the RF electrode 2 facing upward, are placed in a press tool 3, and ceramic powder 5 having a resistance-heating element 4 embedded therein is charged on the RF electrode 2, whereby a molded form made of a ceramic base material having the resistance-heating element 4 embedded therein is formed on the RF electrode 2. Further, the molded form undergoes sintering to form a ceramic heating resistor.

In the step 1 of forming the sintered ceramics 1, ceramic powder having a binder mixed therein is used as material powder. First, the ceramic powder undergoes uniaxial pressing under a pressure of 25 to 500 $kg/cm^2$ to form a molded form, or the ceramic powder undergoes CIP (cold isostatic pressing) under a pressure of 1 to 5 $t/cm^2$ to form a molded form. Techniques for sintering the resulting molded form vary according to the used ceramic powder. For example, hot pressing (HP), pressureless sintering, or hot isostatic pressing (HIP) following presintering under normal pressures can be used to sinter the molded form into sintered ceramics. Preferably, the conditions for sintering using hot pressing, for example, are set so that a temperature lies between 1600 and 1800 degrees centigrade inclusive and a pressure lies between 50 and 200 kg/cm$^2$ inclusive.

The above step 1 is not limited to the formation of sintered ceramics but may comprise forming calcined ceramics. Dense sintered ceramics are difficult to grind. On the other hand, calcined ceramics, into which a molded form is calcined to about 50% in terms of relative density, are relatively easy to grind, so that the calcined ceramics can be worked with higher precision.

For example, a method of manufacturing calcined ceramics can include forming a ceramic material into a molded form, the ceramic material having a binder mixed therein; then dewaxing the molded form; and then calcining the molded form for about 1 to 4 hours in the range of temperatures between 1400 and 1600 degrees centigrade inclusive, which are lower than a sintering temperature, thereby forming calcined ceramics.

Preferably, the above-mentioned sintered ceramics or calcined ceramics are ground into a convex shape at the center on the surface on which the RF electrode is to be formed. The reason is as follows. When the molded form is placed in the press tool for sintering, there is a gap between the surface in contact with the press tool and the molded form. Then, when a uniform pressure is applied to the molded form from above the press tool, the existence of the gap causes the pressure to be reduced on the outer periphery of the press tool, thus resulting in the distribution of higher pressures at the center.

In the embodiment of the invention, the sintered ceramics or calcined ceramics, to which higher pressures are to be applied, are ground into a convex shape at the center according to the pressure distribution. Thus, the embodiment reduces application of non-uniform pressure.

Preferably, the size of the sintered ceramics or calcined ceramics, which are convex in shape at the center on the surface on which the RF electrode is to be formed, is set so that the thickness T lies between 0 and 0.5 mm, provided that the overall thickness A is equal to 4 mm. As employed herein, the thickness T refers to the thickness between the position at which the width of a diameter becomes small and the top of the sintered ceramics or calcined ceramics. More preferably, the thickness T lies between 0.2 and 0.4 mm inclusive.

In the step 2 of forming the RF electrode 2 on the sintered ceramics 1, the RF electrode 2 can be bonded to the sintered ceramics 1 with an adhesive, or the RF electrode 2 can be placed on the sintered ceramics 1 without the use of the adhesive. The RF electrode 2 is placed on the sintered ceramics 1, only when there is not a misalignment or spring-back of the RF electrode 2 placed on the sintered ceramics 1 during molding to be described later.

The step 3 of forming the ceramic base material takes place in the following manner. The ceramic powder 5 is charged into the press tool 3 to form a molded form. Then, a transfer mold is used to form a groove in the molded form, and the resistance-heating element 4 is embedded in the molded form. Then, the ceramic powder 5 is recharged into the press tool 3, and the press tool 3 is used to perform uniaxial pressing, thereby making a molded form. Then, the resulting molded form is sintered into a ceramic base material. Alternatively, the step 3 of forming the ceramic base material may take place in the following manner. First, the ceramic powder 5 is charged into the press tool 3, and the ceramic powder 5 is evened in the press tool 3. Then, a transfer mold is used to form a groove, and the resistance-heating element 4 is placed in the groove. Then, the ceramic powder 5 is recharged into the press tool 3 to preform a molded form. Then, the molded form having the resistance-heating element 4 embedded therein is placed on the RF electrode 2, and the sintered ceramics 1 and the molded form are sintered into a ceramic base material.

Further, the description is given with regard to materials and others for use in the method of manufacturing a ceramic heating resistor according to the embodiment of the invention.

For example when the ceramic heating resistor is used as a thermal CVD apparatus, the ceramic heating resistor is heated at temperatures of up to about 600 to 1100 degrees centigrade, and thus the ceramic heating resistor requires heat resistance. Preferably, the sintered ceramics 1 are therefore made of $Al_2O_3$ (alumina), AlN (aluminum nitride), SiC (silicon carbide), $Si_3N_4$ (silicon nitride), SIALON (Si, Al, O, N), an $Al_2O_3$-SiC composite material, or the like.

Preferably, the sintered ceramics 1 are made of non-oxide ceramics, because non-oxide covalent ceramics have a smaller amount of out-gassing in a high vacuum as compared to oxide ceramics such as $Al_2O_3$. More specifically, the sintered ceramics are made in the following manner. To make sintered AlN, pressure-less sintering or hot pressing takes place using CaO (calcium oxide) or $Y_2O_3$ (yttrium oxide) as a sintering agent. To make sintered SiC, a small amount of B (boron) and C (carbon) or the like is added as a sintering agent to SiC powder, and the SiC powder is sintered at a temperature of 2000 degrees centigrade or higher if pressure-less sintering is used. To make sintered $Si_3N_4$, a small amount of MgO (magnesium oxide) or $Al_2O_3$—$Y_2O_3$ is added as a sintering agent to $Si_3N_4$ powder, and the $Si_3N_4$ powder undergoes hot pressing, hot isostatic pressing, or pressure-less and atmospheric pressure sintering. To make sintered SIALON, hot pressing or pressure-less sintering takes place in a nitrogen atmosphere at temperatures between 1700 and 1800 degrees centigrade inclusive, generally using mixed powder, such as $Si_3N_4$—AlN—$Al_2O_3$, $Si_3N_4$—AlN—$SiO_2$, or $Si_3N_4$—AlN—$Al_2O_3$—$SiO_2$, as a starting material.

Preferably, the sintered AlN of the sintered ceramics 1 mentioned above is used. The sintered AlN has a high thermal conductivity of 100 to 270 W/mk and thus has excellent heat dissipation, and therefore the sintered AlN can achieve corrosion resistance to fluoride etching gas or the like.

Preferably, the RF electrode 2 for generating plasma is made of a high melting point metal such as Mo, W, WC, $Mo_2C$, or W/Mo alloy. An RF supply terminal is connected to the RF electrode 2, and an RF supply cable is connected to the terminal for the RF electrode. The RF electrode 2 has to reduce a reactance component in order to transmit high frequencies, and thus the RF electrode 2 needs a sufficient thickness for a reactance component of 1 Ω or less. Preferably, the RF electrode 2 has a thickness of 8 μm or more when the RF electrode 2 is made of W or Mo.

An electrode in metal bulk or printed form can be used as the RF electrode 2. For example, an electrode of mesh, foil, punching metal or other form can be used. As employed herein, the mesh form refers to a regular mesh of high melting point metal wires, and a mesh having a plurality of slits or holes having a regular or irregular shape on a flat plate.

A mesh of the following size can be used for the RF electrode 2 having the regular mesh of high melting point metal wires. For example, a mesh (#24) having an open loop of 0.71 mm is used for a metal wire having a wire diameter, of 0.35 mm. Incidentally, the open loop indicates an inside dimension corresponding to the space of a mesh. A mesh (#50 or #60) having an open loop of 0.39 or 0.30 mm is used for a metal wire having a wire diameter, of 0.12 mm. A mesh (#24) having an open loop of 0.88 mm is used for a metal wire having a wire diameter, of 0.18 mm. The RF electrode 2 having a thickness of 25 to 150 μm is used as the electrode in foil form.

In the step 2, a natural rubber adhesive such as isoprene, or a double-faced tape made of two component epoxy resin, epoxy, or the like, for example, can be used as the adhesive for bonding the RF electrode 2.

Preferably, the resistance-heating element 4 is made of a high melting point metal, or more preferably W, Mo, Pt (platinum), or an alloy of these metals. The resistance-heating element 4 can have varying shapes. Preferably, the resistance-heating element 4 is wound in a helical fashion and has a spiral shape as viewed from the top surface thereof. A power supply terminal and a power supply cable connected to the power supply terminal are provided on each end of the resistance-heating element 4. During the heating of the ceramic heating resistor, the power supply terminals and cables supply power to heat the resistance-heating element 4. The resistance-heating element 4 is not limited to the configuration of helical winding. The resistance-heating element 4 may have any shape, provided that it can uniformly heat a wafer or the like placed on the ceramic heating resistor.

The same material as the ceramic powder which is the material of the sintered ceramics 1 mentioned above can be used as the material of the ceramic base material formed on the sintered ceramics 1. Specifically, the materials include $Al_2O_3$, AlN, SiC, $Si_3N$, SIALON, and an $Al_2O_3$—SiC composite material. Preferably, the ceramic powder having the same composition as the material of the sintered ceramics 1 is used as the ceramic base material. However, the ceramic base material is not limited to the same or equivalent composition but may be made of a different composition from the composition of the sintered ceramics 1.

A description is given below with regard to examples. Ceramic heating resistors were made by manufacturing methods of examples 6 and a comparative example 1. Measurement and evaluation were made on each ceramic heating resistor. Specifically, the measurement was carried out to measure variations in the thickness of a dielectric layer between a plasma-generating RF electrode embedded in the ceramic heating resistor and the surface of the ceramic heating resistor, and the evaluation was performed to evaluate uniformity in plasma generated by the RF electrode.

EXAMPLES

Examples 1 to 6

[Making of Sintered Ceramics]

Aluminum nitride (AlN) powder containing 5% yttrium oxide ($Y_2O_3$) powder was prepared. The aluminum nitride powder containing the yttrium oxide powder was charged into a uniaxial pressing machine, and the charged powder was uniaxially pressed into a disc-shaped molded form under a pressure of 200 kg/cm². Then, the resulting molded form was sintered into sintered ceramics having a diameter, of 340 mm and a thickness of 8 mm by hot pressing (HP) at a temperature of 1820 degrees centigrade under a pressure of 200 kg/cm².

Then, the resulting disc-shaped sintered ceramics underwent rotary surface grinding. In rotary surface grinding, a diamond grinding wheel #200 was used as a grinding tool to grind the sintered ceramics into a disc shape or a conical shape, thereby forming six types of sintered ceramics. Incidentally, the conical shape means that the sintered ceramics are convex at the center on the surface on which the RF electrode is to be formed.

Figure 2:
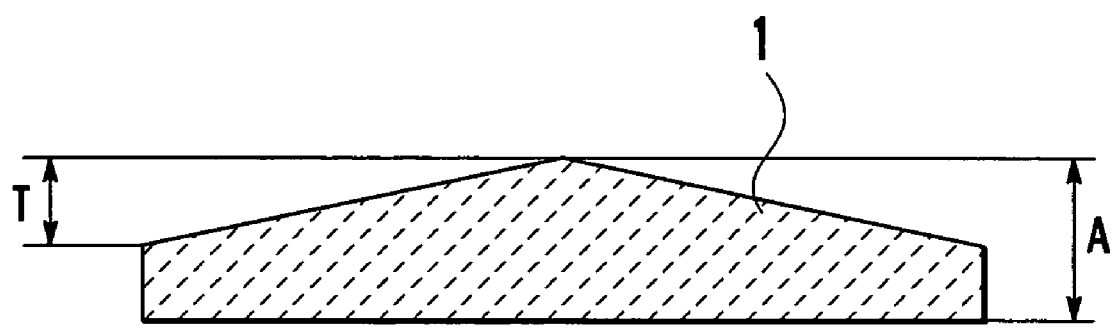
FIG. 2 is a cross-sectional view of sintered ceramics for use in the method of manufacturing a ceramic heating resistor according to the embodiment of the invention.

FIG. 2 shows the cross section of the conical sintered ceramics into which the sintered ceramics are ground. As shown in FIG. 2, the overall thickness A of the sintered ceramics was equal to 4 mm, and the sintered ceramics had varying thickness T of 0 mm, 0.1 mm, 0.2 mm, 0.3 mm, 0.4 mm, and 0.5 mm, which were set for the examples 1, 2, 3, 4, 5, and 6, respectively. As employed herein, the thickness T refers to the thickness between the position at which the width of the diameter becomes small and the top of the sintered ceramics.

[Formation of RF Electrode for Generating Plasma]

A meshed RF electrode 2 made of Mo with a purity of at least 99.95% (size: an inside diameter, of 0.35 mm, a standardized size #24) was bonded to sintered ceramics 1 with isoprene.

Then, the sintered ceramics 1 were vacuum-packed in order that the molded form is tightly bonded to the meshed RF electrode 2. This vacuum packaging was kept for 24 hours. After that, the vacuum packaging was opened, and the sintered ceramics 1 having the meshed RF electrode 2 bonded thereto were taken out of the packaging.

[Step of Molding]

The sintered ceramics 1 having the meshed RF electrode 2 formed thereon were inserted into a press tool 3 having an inside diameter, of 340 mm. Then, a predetermined amount of aluminum nitride (AlN) powder containing 5% yttrium oxide ($Y_2O_3$) powder was charged into the press tool 3 and was evened therein.

Then, a transfer mold was used to form a groove in the evened surface above under a pressure of 200 kg/cm², and determination was made as to where a resistance-heating element 4 should be embedded. The resistance-heating element 4 was embedded in the groove. In this case, the resistance-heating element 4 was made of Mo, which was wound in a helical fashion and had a spiral shape as viewed from the top surface thereof. Then, a predetermined amount of AlN powder containing 5% $Y_2O_3$ powder was charged into the press tool 3 and was evened therein. Then, a molded form was formed under a pressure of 200 kg/cm².

[Step of Sintering]

The molded form was taken out of the press tool 3. Then, the molded form was sintered into a ceramic heating resistor by hot pressing for 6 hours at a temperature of 1820 degrees centigrade in an atmosphere under a nitrogen pressure of 0.5 kg/cm²G.

Comparative Example 1

A ceramic heating resistor of the comparative example was made by molding ceramic powder without the use of the sintered ceramics for use in the manufacture of the ceramic heating resistors of the examples 1 to 6. Incidentally, the used material, the materials of the RF electrode and the resistance-heating element and the sintering conditions of the comparative example were the same as those of the examples 1 to 6 mentioned above.

Specifically, aluminum nitride (AlN) powder containing 5% yttrium oxide ($Y_2O_3$) powder was charged into a press tool, and then a meshed RF electrode made of Mo was disposed on the charged powder. Thereafter, the same ceramic powder was charged into the press tool, then a resistance-heating element was disposed in the ceramic powder, and then the same ceramic powder was charged into the press tool. Then, the ceramic powder was formed into a molded form under a pressure of 200 kg/cm$^2$, and then the molded form was sintered into a ceramic heating resistor.

Each of the ceramic heating resistors of the examples 1 to 6 and the comparative example 1 was ground by using a varying angles (degree) at a radius of 140 mm of the center point (Nos.10 to 18 in Table 1).

The inclination of the plasma-generating RF electrode was calculated using the method of least squares, based on data obtained by measuring variations in the thickness of the dielectric layer, in order to minimize the range of variations in the thickness of the dielectric layer. Further oblique grinding took place according to the results of calculation of the inclination of the plasma-generating electrode so that the dielectric layer might have a thickness of 2.6 mm. A diamond grinding wheel #400 was used for oblique grinding, and a rotary surface-grinding machine was used for surface grinding.

Figure 3:
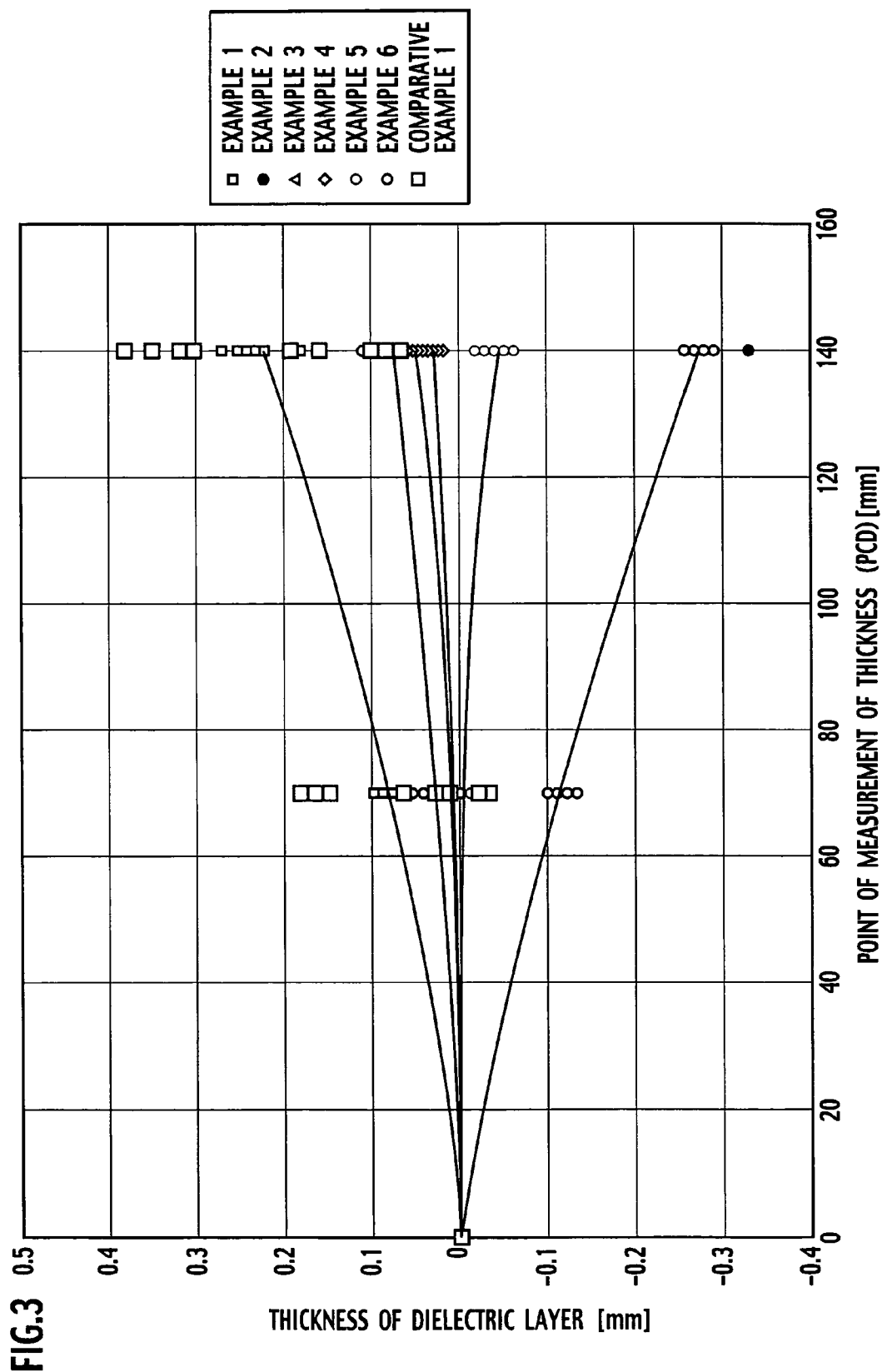
FIG. 3 is a plot showing the relation between the measured thickness of a dielectric layer and the point of measurement (PCD) in each of ceramic heating resistors made by examples 1 to 6 and a comparative example 1.

In Table 1 and FIG. 3, results are shown of measurement of variations in the thickness of the dielectric layer of each of the ceramic heating resistors of the examples 1 to 6 and the comparative example 1.

TABLE 1

| | | | Example 1 | | Example 2 | | Example 3 | | Example 4 | | Example 5 | | Example 6 | | Comparative example 1 | |
|---|---|---|---|---|---|---|---|---|---|---|---|---|---|---|---|---|
| Shape of sintered ceramics | | | Disc shape | | | | Conical shape | | | | | | | | Disc shape | |
| Thickness T [mm] | | | 0.0 | | 0.1 | | 0.2 | | 0.3 | | 0.4 | | 0.5 | | 0.0 | |
| Thickness of dielectric layer [mm] | Max | | 0.27 | | 0.11 | | 0.07 | | 0.03 | | 0.01 | | 0.00 | | 0.38 | |
| | Min | | 0.00 | | 0.00 | | (0.01) | | (0.01) | | (0.06) | | −0.33 | | −0.03 | |
| Width of dielectric layer | | | 0.27 | | 0.11 | | 0.08 | | 0.04 | | 0.07 | | 0.33 | | 0.41 | |

| Point of measurement of thickness of dielectric layer | | | Thickness of dielectric layer [mm] | | | | | | | | | | | | | |
|---|---|---|---|---|---|---|---|---|---|---|---|---|---|---|---|---|
| No. | Radius [mm] | Angle [°] | Measured value | Standardized | Measured value | Standardized | Measured value | Standardized | Measured value | Standardized | Measured value | Standardized | Measured value | Standardized | Measured value | Standardized |
| 1 | 0 | 0 | 2.48 | 0.00 | 2.57 | 0.00 | 2.57 | 0.00 | 2.57 | 0.00 | 2.57 | 0.00 | 2.70 | 0.00 | 2.78 | 0.00 |
| 2 | 70 | 0 | 2.54 | 0.06 | 2.57 | 0.00 | 2.57 | 0.00 | 2.57 | 0.00 | 2.57 | 0.00 | 2.57 | −0.13 | 2.75 | (0.03) |
| 3 | 70 | 45 | 2.55 | 0.07 | 2.58 | 0.01 | 2.58 | 0.01 | 2.58 | 0.01 | 2.58 | 0.01 | 2.58 | −0.12 | 2.80 | 0.02 |
| 4 | 70 | 90 | 2.55 | 0.07 | 2.60 | 0.03 | 2.58 | 0.01 | 2.58 | 0.01 | 2.58 | 0.01 | 2.58 | −0.12 | 2.84 | 0.06 |
| 5 | 70 | 135 | 2.54 | 0.06 | 2.61 | 0.04 | 2.59 | 0.02 | 2.59 | 0.02 | 2.67 | 0.00 | 2.57 | −0.13 | 2.79 | 0.01 |
| 6 | 70 | 180 | 2.56 | 0.08 | 2.60 | 0.02 | 2.58 | 0.01 | 2.58 | 0.00 | 2.67 | 0.00 | 2.58 | −0.12 | 2.79 | 0.01 |
| 7 | 70 | 225 | 2.58 | 0.10 | 2.62 | 0.04 | 2.56 | −0.01 | 2.60 | 0.02 | 2.64 | −0.03 | 2.59 | −0.11 | 2.81 | 0.03 |
| 8 | 70 | 270 | 2.56 | 0.08 | 2.63 | 0.05 | 2.57 | 0.00 | 2.57 | −0.01 | 2.65 | −0.02 | 2.60 | −0.1 | 2.84 | 0.06 |
| 9 | 70 | 315 | 2.57 | 0.09 | 2.61 | 0.03 | 2.59 | 0.02 | 2.59 | 0.01 | 2.66 | −0.01 | 2.59 | −0.11 | 2.76 | (0.02) |
| 10 | 140 | 22.5 | 2.66 | 0.18 | 2.62 | 0.04 | 2.62 | 0.05 | 2.60 | 0.02 | 2.65 | −0.02 | 2.37 | −0.33 | 2.94 | 0.16 |
| 11 | 140 | 62.5 | 2.66 | 0.18 | 2.65 | 0.07 | 2.60 | 0.03 | 2.60 | 0.02 | 2.61 | −0.06 | 2.44 | −0.26 | 3.13 | 0.35 |
| 12 | 140 | 102.5 | 2.67 | 0.19 | 2.63 | 0.05 | 2.63 | 0.06 | 2.61 | 0.03 | 2.63 | −0.04 | 2.43 | −0.27 | 3.16 | 0.38 |
| 13 | 140 | 142.5 | 2.70 | 0.22 | 2.64 | 0.06 | 2.64 | 0.07 | 2.61 | 0.03 | 2.64 | −0.03 | 2.44 | −0.26 | 2.85 | 0.07 |
| 14 | 140 | 182.5 | 2.71 | 0.23 | 2.63 | 0.05 | 2.63 | 0.06 | 2.61 | 0.03 | 2.63 | −0.04 | 2.42 | −0.28 | 2.86 | 0.08 |
| 15 | 140 | 222.5 | 2.72 | 0.24 | 2.68 | 0.10 | 2.61 | 0.04 | 2.61 | 0.03 | 2.61 | −0.06 | 2.41 | −0.29 | 3.08 | 0.30 |
| 16 | 140 | 262.5 | 2.73 | 0.25 | 2.67 | 0.09 | 2.62 | 0.05 | 2.61 | 0.03 | 2.62 | −0.05 | 2.42 | −0.28 | 3.10 | 0.32 |
| 17 | 140 | 302.5 | 2.75 | 0.27 | 2.69 | 0.11 | 2.61 | 0.04 | 2.61 | 0.03 | 2.61 | −0.06 | 2.44 | −0.26 | 2.97 | 0.19 |
| 18 | 140 | 342.5 | 2.71 | 0.23 | 2.69 | 0.11 | 2.62 | 0.05 | 2.60 | 0.02 | 2.62 | −0.05 | 2.44 | −0.26 | 2.88 | 0.10 | rotary surface grinding machine or a cylindrical grinding machine. In this case, each ceramic heating resistor was ground so as to have a diameter, of 337 mm and a thickness of 30 mm. Then, the thickness of a dielectric layer of each ceramic heating resistor was measured.

[Measurement of the Thickness of the Dielectric Layer]

Measurement was made by using an eddy-current thickness tester to measure variations in the thickness of the dielectric layer in the ceramic heating resistor's surface having the plasma-generating RF electrode embedded therein. Variations in the thickness of the dielectric layer were measured on a total of 18 points, that is, the center point of the disc-shaped sintered ceramics (No.1 in Table 1), 8 points at varying angles (degree) at a radius of 70 mm of the center point (Nos.2 to 9 in Table 1), and 9 points at As shown in Table 1 and FIG. 3, the ceramic heating resistors of the examples 1 to 6 using sintered AlN were not shrunk or otherwise deformed during sintering, so that the plasma-generating electrode could be flatly embedded in the ceramic heating resistor. Thus, the dielectric layers of the ceramic heating resistors of the examples 1 to 6 were as thin as 0.04 to 0.33 mm. As is apparent from this fact, these ceramic-heating resistors can ensure uniform generation of plasma. Moreover, the ceramic heating resistors of the examples 2 to 6 were manufactured by using sintered AlN, which was ground so that its upper portion was conical and the thickness T of the conical portion was between 0.1 and 0.4 mm inclusive. These ceramic heating resistors could reduce application of high pressure to the center, so that the thickness of the dielectric layers was 0.11 mm or less. As is clear from this fact, these ceramic-heating resistors can ensure uniform generation of plasma. Furthermore, the ceramic heating resistor of the example 4 using conical sintered AlN having a thickness T of 0.3 mm could be subjected to uniform pressure during sintering, so that the dielectric layer had the minimum thickness, i.e., a thickness of 0.04 mm. As is apparent from this fact, the ceramic heating resistor of the example 4 can ensure uniform generation of plasma. On the other hand, the ceramic heating resistor of the comparative example 1 using the molded form of ceramic powder without the use of sintered AlN had a dielectric layer of 0.38 mm thick. There was a wide range of variations in the thickness of the dielectric layer, which caused non-uniform generation of plasma.

In the above-mentioned examples 1 to 6, the ceramic heating resistor is taken as an example of the electrical-resistance heating element, and the RF electrode 2 is used only for generating plasma. However, the electrical-resistance heating element is not limited to the ceramic heating resistor may be used as an electrostatic chuck, an RF susceptor, or the like. When the electrical-resistance heating element is used as the electrostatic chuck, the RF electrode 2 is used as an electrostatic chuck electrode which uses capacitance to chuck a wafer. More specifically, a DC voltage for generating capacitance is applied to the RF electrode 2, and at the same time, an RF signal is supplied to the RF electrode 2 via a transformer. Thus, a wafer can adhere to the top surface of the ceramic heating resistor, and at the same time, plasma can be generated. To supply the RF signal, a cable requires a resistance value of 1, or less. When the RF electrode 2 is made of W (tungsten), four cables having a diameter, of at least 10 mm are necessary. This is considerably different from the case where a cable having a resistance value of 0 to a few hundreds of, and a diameter, of about 0.1 mm can be used when only the RF electrode 2 is used as the electrostatic chuck electrode.

The method of manufacturing an electrical-resistance heating element of the invention can reduce the range of variations in the thickness of the dielectric layer, thus ensuring uniform generation of plasma, and thus improving the yield of products.

Although the invention has been described above by reference to certain embodiment of the invention, the invention is not limited the embodiment described above. Modifications and variations of the embodiment described above will occur to those skilled in the art, in light of the teachings. The scope of the invention is defined with reference to the following claims.

What is claimed is:

1. A method of manufacturing an electrical-resistance heating element, the method comprising the steps of:
   forming sintered ceramics or calcined ceramics;
   forming an electrode on the sintered ceramics or the calcined ceramics; placing ceramic powder on the sintered ceramics or calcined ceramics and the electrode;
   forming a groove in the ceramic powder;
   placing a high melting point metal into the groove to form a heating element;
   placing an additional amount of ceramic powder on the previously placed ceramic powder and the high melting point metal; and
   forming the ceramic powder and the high melting point metal into a molded form, thereby forming a heating element with a built-in electrode.

2. The method according to claim 1, further comprising:
   grinding the sintered ceramics or the calcined ceramics into a convex shape at the center on the surface of the sintered ceramics or the calcined ceramics on which the electrode is to be formed, and
   wherein the grinding is followed by the step of forming the electrode.

3. The method according to claim 2, wherein the grinding takes place so that the ratio of the thickness T to the overall thickness A (T/A) is equal to or less than ⅛, where the overall thickness A is the overall thickness of the sintered ceramics or the calcined ceramics, and the thickness T is the thickness of the ground sintered or calcined ceramics having an upper portion in convex shape, between the position at which the width of the diameter of the sintered or calcined ceramics becomes small and the top of the sintered or calcined ceramics.

4. The method according to claim 1, wherein the heating element with built-in electrode is any one selected from the group consisting of a heater, an electrostatic chuck, and a susceptor.

5. The method according to claim 1, wherein the electrode is selected from the group consisting of a linear, plate and meshed electrode made of a bulk.

6. The method according to claim 1, wherein the electrode is selected from the group consisting of a linear, plate and meshed electrode made of printed body.

7. The method according to claim 1, wherein the electrode is a high melting point metal as a main component.

8. The method according to claim 1, wherein the sintered ceramics or the calcined ceramics includes at least one of ceramic powder selected from the group consisting of aluminum nitride, silicon carbide, and silicon nitride.

9. The method according to claim 1, wherein the sintered ceramics or the calcined ceramics includes at least one of ceramic powder selected from the group consisting of aluminum nitride, silicon carbide, and silicon nitride, and the said ceramic powder is formed into a molded form, which is then sintered or calcined into a sintered or calcined form, and is the sintered ceramics or the calcined ceramics.

10. The method according to claim 1, wherein the high melting point metal is at least any one of metal selected from the group consisting of Mo (molybdenum), W (tungsten), WC (tungsten carbide), $Mo_2C$, and W/Mo alloy.

11. The method according to claim 1, further comprising the step of sintering or calcining the molded form, thereby forming the ceramic base material.

* * * * *